United States Patent
Poole et al.

(10) Patent No.: US 8,692,442 B2
(45) Date of Patent: Apr. 8, 2014

(54) POLYMER TRANSDUCER AND A CONNECTOR FOR A TRANSDUCER

(75) Inventors: Alan David Poole, Soenderborg (DK); Jakob Oubaek, Aabenraa (DK)

(73) Assignee: Danfoss Polypower A/S, Nordborg (DK)

( * ) Notice: Subject to any disclaimer, the term of this patent is extended or adjusted under 35 U.S.C. 154(b) by 0 days.

(21) Appl. No.: 13/372,942

(22) Filed: Feb. 14, 2012

(65) Prior Publication Data

US 2013/0207510 A1    Aug. 15, 2013

(51) Int. Cl.
H01L 41/047    (2006.01)
H01L 41/16    (2006.01)
H02N 2/00    (2006.01)

(52) U.S. Cl.
USPC ............... 310/364; 310/328; 310/800

(58) Field of Classification Search
USPC ............ 310/311, 328, 363, 364, 800
See application file for complete search history.

(56) References Cited

U.S. PATENT DOCUMENTS

| | | |
|---|---|---|
| 2,130,532 A | 9/1938 | Bailey |
| 2,716,708 A | 8/1955 | Bradfield |
| 3,109,202 A | 11/1963 | Beckadolph et al. |
| 3,138,962 A | 6/1964 | Haines, Jr. et al. |
| 3,544,733 A | 12/1970 | Reylek et al. |
| 3,565,195 A | 2/1971 | Miller et al. |
| 3,753,294 A | 8/1973 | Attali et al. |
| 3,831,629 A | 8/1974 | Mackal et al. |
| 3,875,481 A | 4/1975 | Miller et al. |
| 3,898,585 A | 8/1975 | Heidrich et al. |
| 3,898,722 A | 8/1975 | Foote |
| 3,912,830 A | 10/1975 | Murayama et al. |
| 4,259,607 A | 3/1981 | Noguchi et al. |
| 4,266,263 A | 5/1981 | Haberl et al. |
| 4,322,877 A | 4/1982 | Taylor |
| 4,330,730 A | 5/1982 | Kurz et al. |
| 4,370,697 A | 1/1983 | Haberl et al. |
| 4,376,302 A | 3/1983 | Miller |
| 4,384,394 A | 5/1983 | Lemonon et al. |
| 4,386,386 A | 5/1983 | Akita |

(Continued)

FOREIGN PATENT DOCUMENTS

| | | |
|---|---|---|
| DE | 30 23 218 A1 | 2/1982 |
| DE | 38 41 243 A1 | 6/1990 |

(Continued)

OTHER PUBLICATIONS

Shankar et al., "Mechanical and actuation behavior of electroactive nanostructured polymers", Sensors and Actuators A (2009) pp. 46-52, vol. 151, nr. 1.

(Continued)

Primary Examiner — Thomas Dougherty
(74) Attorney, Agent, or Firm — McCormick, Paulding & Huber LLP

(57) ABSTRACT

The invention provides a transducer comprising conductors and a laminate. The laminate comprises a film of a dielectric polymer material arranged between first and second electrodes. Each electrode is in electrically conductive communication with at least one of the conductors to facilitate an electrical potential between the electrodes and thereby enable deflection of the polymer material in response to an electrical field. At least one of the conductors is an elastically deformable conductor comprising a compliant core which is electrically conductive. The core is enclosed in a containment having elastomeric properties.

23 Claims, 14 Drawing Sheets

(56) References Cited

U.S. PATENT DOCUMENTS

| | | | |
|---|---|---|---|
| 4,431,882 A | 2/1984 | Frame | |
| 4,494,409 A | 1/1985 | Kondo et al. | |
| 4,549,093 A | 10/1985 | Severwright | |
| 4,584,625 A | 4/1986 | Kellogg | |
| 4,634,917 A | 1/1987 | Dvorsky et al. | |
| 4,640,137 A | 2/1987 | Trull et al. | |
| 4,654,546 A | 3/1987 | Kirjavainen | |
| 4,654,834 A | 3/1987 | Dorr | |
| 4,731,694 A | 3/1988 | Grabner et al. | |
| 4,786,837 A | 11/1988 | Kalnin et al. | |
| 4,825,116 A | 4/1989 | Itoh et al. | |
| 4,829,812 A | 5/1989 | Parks et al. | |
| 4,836,033 A | 6/1989 | Seitz | |
| 4,852,443 A | 8/1989 | Duncan et al. | |
| 4,866,412 A | 9/1989 | Rzepczynski | |
| 4,879,698 A | 11/1989 | Langberg | |
| 4,986,136 A | 1/1991 | Brunner et al. | |
| 5,016,008 A | 5/1991 | Gruaz et al. | |
| 5,028,876 A | 7/1991 | Cadwell | |
| 5,048,536 A | 9/1991 | McEwen | |
| 5,060,527 A | 10/1991 | Burgess | |
| 5,090,246 A | 2/1992 | Colla et al. | |
| 5,090,248 A | 2/1992 | Cimmino et al. | |
| 5,115,680 A | 5/1992 | Lew | |
| 5,172,024 A | 12/1992 | Broussoux et al. | |
| 5,173,162 A | 12/1992 | Hagimura et al. | |
| 5,225,959 A | 7/1993 | Stearns | |
| 5,255,972 A | 10/1993 | Shirasu | |
| 5,259,099 A | 11/1993 | Banno et al. | |
| 5,300,813 A | 4/1994 | Joshi et al. | |
| 5,319,153 A | 6/1994 | Fishman | |
| 5,321,332 A | 6/1994 | Toda | |
| 5,325,012 A | 6/1994 | Sato et al. | |
| 5,341,062 A | 8/1994 | Cero, Jr. et al. | |
| 5,410,210 A | 4/1995 | Sato et al. | |
| 5,425,275 A | 6/1995 | Lockshaw | |
| 5,447,076 A | 9/1995 | Ziegler | |
| 5,449,002 A | 9/1995 | Goldman | |
| 5,494,090 A | 2/1996 | Kejha | |
| 5,515,341 A | 5/1996 | Toda et al. | |
| 5,520,630 A | 5/1996 | Daneshvar | |
| 5,528,452 A | 6/1996 | Ko | |
| 5,547,508 A | 8/1996 | Affinito | |
| 5,548,564 A | 8/1996 | Smith | |
| 5,556,700 A * | 9/1996 | Kaneto et al. | 428/332 |
| 5,559,387 A | 9/1996 | Beurrier | |
| 5,642,015 A | 6/1997 | Whitehead et al. | |
| 5,755,090 A | 5/1998 | Hu | |
| 5,755,909 A | 5/1998 | Gailus | |
| 5,760,530 A | 6/1998 | Kolesar | |
| 5,817,099 A | 10/1998 | Skolik et al. | |
| 5,841,143 A | 11/1998 | Tuma et al. | |
| 5,888,646 A | 3/1999 | Takahashi et al. | |
| 5,891,065 A | 4/1999 | Cariapa et al. | |
| 5,977,685 A | 11/1999 | Kurita et al. | |
| 5,997,465 A | 12/1999 | Savage et al. | |
| 6,008,580 A | 12/1999 | Nakamura et al. | |
| 6,008,582 A | 12/1999 | Asano et al. | |
| 6,008,583 A | 12/1999 | Breuer et al. | |
| 6,108,175 A | 8/2000 | Hawwa et al. | |
| 6,123,681 A | 9/2000 | Brown, III | |
| RE37,065 E | 2/2001 | Grahn | |
| 6,208,065 B1 | 3/2001 | Ueyama | |
| 6,210,514 B1 | 4/2001 | Cheung et al. | |
| 6,216,495 B1 | 4/2001 | Couzan et al. | |
| 6,255,758 B1 | 7/2001 | Cabuz et al. | |
| 6,282,956 B1 | 9/2001 | Okada | |
| 6,343,129 B1 | 1/2002 | Pelrine et al. | |
| 6,362,559 B1 | 3/2002 | Boyd | |
| 6,376,971 B1 * | 4/2002 | Pelrine et al. | 310/363 |
| 6,411,015 B1 | 6/2002 | Toda | |
| 6,437,489 B1 | 8/2002 | Shinke et al. | |
| 6,511,709 B1 | 1/2003 | Barnes et al. | |
| 6,543,110 B1 | 4/2003 | Pelrine et al. | |
| 6,545,384 B1 | 4/2003 | Pelrine et al. | |
| 6,545,395 B2 | 4/2003 | Matsui et al. | |
| 6,558,577 B1 * | 5/2003 | Niihara et al. | 252/511 |
| 6,581,481 B1 | 6/2003 | Perusek | |
| 6,583,533 B2 | 6/2003 | Pelrine et al. | |
| 6,586,859 B2 | 7/2003 | Kornbluh et al. | |
| 6,628,040 B2 | 9/2003 | Pelrine et al. | |
| 6,662,658 B2 | 12/2003 | Foote | |
| 6,664,718 B2 | 12/2003 | Pelrine et al. | |
| 6,700,304 B1 | 3/2004 | Fuller et al. | |
| 6,700,312 B2 | 3/2004 | Iizuka et al. | |
| 6,707,236 B2 | 3/2004 | Pelrine et al. | |
| 6,759,769 B2 | 7/2004 | Kirjavainen | |
| 6,768,246 B2 | 7/2004 | Pelrine et al. | |
| 6,781,284 B1 | 8/2004 | Pelrine et al. | |
| 6,806,621 B2 | 10/2004 | Heim et al. | |
| 6,809,462 B2 | 10/2004 | Pelrine et al. | |
| 6,812,624 B1 | 11/2004 | Pei et al. | |
| 6,876,135 B2 | 4/2005 | Pelrine et al. | |
| 6,882,086 B2 | 4/2005 | Kornbluh et al. | |
| 6,891,317 B2 | 5/2005 | Pei et al. | |
| 6,911,764 B2 | 6/2005 | Pelrine et al. | |
| 6,940,211 B2 | 9/2005 | Pelrine et al. | |
| 7,034,432 B1 | 4/2006 | Pelrine et al. | |
| 7,049,732 B2 | 5/2006 | Pei et al. | |
| 7,064,472 B2 | 6/2006 | Pelrine et al. | |
| 7,104,146 B2 | 9/2006 | Benslimane et al. | |
| 7,198,832 B2 | 4/2007 | Burrows et al. | |
| 7,211,937 B2 | 5/2007 | Kornbluh et al. | |
| 7,518,284 B2 | 4/2009 | Benslimane et al. | |
| 7,548,015 B2 | 6/2009 | Benslimane et al. | |
| 7,573,064 B2 | 8/2009 | Benslimane et al. | |
| 7,732,999 B2 * | 6/2010 | Clausen et al. | 310/369 |
| 7,808,163 B2 | 10/2010 | Benslimane et al. | |
| 7,843,111 B2 | 11/2010 | Benslimane et al. | |
| 7,880,371 B2 | 2/2011 | Benslimane et al. | |
| 8,421,316 B2 | 4/2013 | Tryson et al. | |
| 2001/0026165 A1 | 10/2001 | Pelrine et al. | |
| 2001/0035723 A1 | 11/2001 | Pelrine et al. | |
| 2002/0008445 A1 | 1/2002 | Pelrine et al. | |
| 2002/0041017 A1 | 4/2002 | Hauser et al. | |
| 2002/0050768 A1 | 5/2002 | Beck et al. | |
| 2002/0130673 A1 | 9/2002 | Pelrine et al. | |
| 2002/0175594 A1 | 11/2002 | Kornbluh et al. | |
| 2002/0175598 A1 | 11/2002 | Heim et al. | |
| 2002/0185937 A1 | 12/2002 | Heim et al. | |
| 2003/0006669 A1 | 1/2003 | Pei et al. | |
| 2003/0066741 A1 | 4/2003 | Burgess et al. | |
| 2003/0067245 A1 | 4/2003 | Pelrine et al. | |
| 2003/0125781 A1 | 7/2003 | Dohno et al. | |
| 2003/0141473 A1 | 7/2003 | Pelrine et al. | |
| 2003/0141787 A1 | 7/2003 | Pelrine et al. | |
| 2003/0213960 A1 | 11/2003 | Kitagawa et al. | |
| 2003/0214199 A1 | 11/2003 | Heim et al. | |
| 2004/0008853 A1 | 1/2004 | Pelrine et al. | |
| 2004/0012301 A1 | 1/2004 | Benslimane et al. | |
| 2004/0056567 A1 | 3/2004 | Menzel | |
| 2004/0068220 A1 | 4/2004 | Couvillon, Jr. et al. | |
| 2004/0124738 A1 | 7/2004 | Pelrine et al. | |
| 2004/0217671 A1 | 11/2004 | Rosenthal et al. | |
| 2004/0232807 A1 | 11/2004 | Pelrine et al. | |
| 2004/0263028 A1 | 12/2004 | Pei et al. | |
| 2005/0040736 A1 | 2/2005 | Topliss et al. | |
| 2005/0046313 A1 | 3/2005 | Basheer et al. | |
| 2005/0089673 A1 | 4/2005 | Fleming et al. | |
| 2005/0104145 A1 | 5/2005 | Benslimane et al. | |
| 2005/0113892 A1 | 5/2005 | Sproul | |
| 2005/0157893 A1 | 7/2005 | Pelrine et al. | |
| 2006/0016275 A1 | 1/2006 | Gravesen et al. | |
| 2006/0066183 A1 | 3/2006 | Benslimand et al. | |
| 2006/0079824 A1 | 4/2006 | Munch-Fals et al. | |
| 2006/0113878 A1 | 6/2006 | Pei et al. | |
| 2006/0113880 A1 | 6/2006 | Pei et al. | |
| 2006/0119225 A1 | 6/2006 | Heim et al. | |
| 2006/0155197 A1 | 7/2006 | Kishimoto et al. | |
| 2006/0158065 A1 | 7/2006 | Pelrine et al. | |
| 2007/0114885 A1 | 5/2007 | Benslimane et al. | |
| 2007/0116858 A1 | 5/2007 | Benslimane et al. | |
| 2007/0128059 A1 | 6/2007 | Bagwell | |
| 2007/0269585 A1 | 11/2007 | Benslimane et al. | |

(56) References Cited

U.S. PATENT DOCUMENTS

| | | | |
|---|---|---|---|
| 2007/0277356 | A1 | 12/2007 | Benslimand et al. |
| 2008/0038860 | A1 | 2/2008 | Benslimane et al. |
| 2008/0093954 | A1 | 4/2008 | Benslimand et al. |
| 2008/0226878 | A1 | 9/2008 | Benslimane et al. |
| 2008/0238258 | A1 | 10/2008 | Ishiguro et al. |
| 2008/0265709 | A1 | 10/2008 | Clausen et al. |
| 2009/0000597 | A1 | 1/2009 | Kronberger |
| 2009/0064476 | A1 | 3/2009 | Cross et al. |
| 2009/0072658 | A1 | 3/2009 | Benslimane et al. |
| 2009/0130423 | A1 | 5/2009 | Keady |
| 2009/0154053 | A1 | 6/2009 | Biggs et al. |
| 2009/0169829 | A1 | 7/2009 | Benslimane et al. |
| 2009/0239039 | A1 | 9/2009 | Benslimane et al. |
| 2009/0273483 | A1 | 11/2009 | Tompkins et al. |
| 2011/0018400 | A1 | 1/2011 | Kato et al. |
| 2011/0116858 | A1 | 5/2011 | Burrowes |
| 2011/0210344 | A1 | 9/2011 | Han et al. |
| 2011/0232744 | A1 | 9/2011 | Larsen et al. |
| 2012/0003427 | A1 | 1/2012 | Kuroda et al. |
| 2013/0207510 | A1 | 8/2013 | Poole et al. |
| 2013/0208397 | A1 | 8/2013 | Benslimane |

FOREIGN PATENT DOCUMENTS

| | | | | |
|---|---|---|---|---|
| DE | 198 26 391 | A1 | | 12/1999 |
| DE | 200 04 248 | U1 | | 7/2000 |
| DE | 100 54 247 | A1 | | 5/2002 |
| EP | 0 387 180 | A1 | | 9/1990 |
| EP | 0 421 368 | A1 | | 4/1991 |
| EP | 0 468 796 | B1 | | 1/1992 |
| EP | 0 761 188 | A2 | | 3/1997 |
| EP | 0 855 307 | B1 | | 7/1998 |
| EP | 1 323 925 | B1 | | 7/2003 |
| EP | 1 324 403 | A1 | | 7/2003 |
| EP | 1 481 738 | A2 | | 12/2004 |
| EP | 1 748 190 | B1 | | 1/2007 |
| EP | 1 919 072 | A1 | | 5/2008 |
| EP | 2 136 419 | A2 | | 12/2009 |
| FR | 2 309 833 | | | 11/1976 |
| GB | 2 042 256 | A | | 9/1980 |
| JP | 55-42474 | A | | 3/1980 |
| JP | 55-91299 | A | | 7/1980 |
| JP | 61-138651 | A | * | 6/1986 ............... 252/512 |
| JP | 1-273372 | | | 11/1989 |
| JP | 04-014448 | | | 1/1992 |
| JP | 2001286162 | A | | 10/2001 |
| JP | 2002237625 | A | | 8/2002 |
| JP | 2005-117103 | A | | 4/2005 |
| JP | 2007-11206 | A | | 1/2007 |
| JP | 2008-205180 | A | | 9/2008 |
| KR | 90-1465 | | | 3/1990 |
| WO | 96/34701 | A1 | | 11/1996 |
| WO | 97/27822 | A1 | | 8/1997 |
| WO | 00/66970 | A1 | | 11/2000 |
| WO | 01/06575 | A1 | | 1/2001 |
| WO | 01/06579 | A2 | | 1/2001 |
| WO | 01/58973 | A2 | | 8/2001 |
| WO | 01/59852 | A3 | | 8/2001 |
| WO | 01/63738 | A2 | | 8/2001 |
| WO | 01/65615 | A3 | | 9/2001 |
| WO | 02/037660 | A1 | | 10/2002 |
| WO | 2004/079832 | A2 | | 9/2004 |
| WO | 2005/079187 | A2 | | 9/2005 |
| WO | 2005/081676 | A2 | | 9/2005 |
| WO | 2006/012826 | A1 | | 2/2006 |
| WO | 2008/052559 | A2 | | 5/2008 |
| WO | 2008/063590 | A1 | | 5/2008 |
| WO | 2008 156166 | A1 | | 12/2008 |

OTHER PUBLICATIONS

Danish Search Report for PA 2012 00118 dated Sep. 14, 2012.
International Search Report for PCT Serial No. PCT/DK2013/000014 dated May 14, 2013.
Soo-Lim Chua et al. "Multi-Walled Carbon Nanotubes (MWCNT) as Compliant Electrodes for Dielectric Elastomer Actuators" vol. 7976, Mar. 24, 2011 p. 79760V, XP055062885; ISSN: 0277-786X, DOI 10.1117/12.880486.
PCT Search Report for Serial No. PCT/DK03/00603 dated Feb. 5, 2004.
PCT Search Report for Serial No. PCT/DK03/00848 dated Mar. 25, 2004.
PCT Search Report for Serial No. PCT/DK2009/000098 dated Jul. 3, 2009.
PCT Search Report for Serial No. PCT/DK2009/000097 dated Aug. 7, 2009.
PCT Search Report for Serial No. PCT/DK2009/000131 dated Oct. 7, 2009.
Danish Search Report for Serial No. PA 2008 00757 dated Jan. 14, 2009.
U.S. Appl. No. 12/990,333, filed Apr. 26, 2011 and entitled A Power Actuated Valve.
U.S. Appl. No. 12/990,300, filed Apr. 26, 2011 and entitled A Pump Powered by a Polymer Transducer.
U.S. Appl. No. 12/996,711, filed Apr. 27, 2011 and entitled A Transducer Compromising a Composite Material and Method of Making Such a Composite Material.
Article entitled "Electrostrictive Polymer Artificial Muscle Actuators" by R. Kornbluh, et al., SRI International, Proceedings of the 1998 IEEE International Conference on Robotics & Automation, Belgium, May 1998; pp. 2147-2154.
Article entitled "Spontaneous formation of ordered structures in thin films of metals supported on an elastomeric polymer" by N. Bowden, et al., Nature, vol. 393 dated May 14, 1998; pp. 146-148.
Article "Silicone Elastomers with Controlled Surface Composition Using Argon or Hydrogen Plasma Treatment" by B. Olander, et al., Journal of Applied Polymer Science, vol. 90, 2003 Wiley Periodicals, Inc.; pp. 1378-1383.
Pelrine R. et al., Applications of Dielectric Elastomer Actuators,Proceedings of the Spie—The International Society for Optical Engineering, Spie, PO Box 10 Bellingham WA 98277-0010 USA, vol. 4329, Jan. 1, 2001, pp. 335-349, XP002381626 ISSN:0277-786X.
Publication "High-field electrostriction of elastomeric polymer dielectrics for actuation" by Roy Kornbluh et al., SRI International; SPIE vol. 3669, pp. 149-161; Mar. 1999.
Publication Micro-Electro-Mechanical Systems (MEMS)—2000—; by R. Trujillo, et al;; Presented at 2000 ASIME International Mechanical Engineering Congress and Exposition, Nov. 5-10, 2000, Orlando, FL; pp. 709-716.
Keyes, Robert W.: "Microstructure Fabrication", May 27, 1977, Science, vol. 196, No. 4293, pp. 945-949.
Ul-Haq S. et al, Breakdown pattern identification in high temperature dielectric films using scanning electron microscopy (SEM), 2003 Annual Report Conference on Electrical Insulation and Dielectric Phenomena, 265-268, Department of Electrical and Computer Engineering, University of Windsor, Windsor, Ontario, Canada, N9B 3P4.
Jean-Mistral C. et al, Dielectric polymer: scavenging energy from human motion, Electroactive Polymer Actuators and Devices (EAPAD) 2008, edited by Yoseph Bar-Cohen Proc. of SPIE vol. 6927, 692716, (2008).
Yu M, et al, Nonlinear analysis of sensor diaphragm under initial tension, Department of Mechanical Engineering, University of Maryland, Smart structures and Materials 2005: Modeling, Signal Processing, and Control, edited by Ralph C. Smith, Proc. of SPIE vol. 5757 (SPIE, Bellingham, WA, 2005).

* cited by examiner

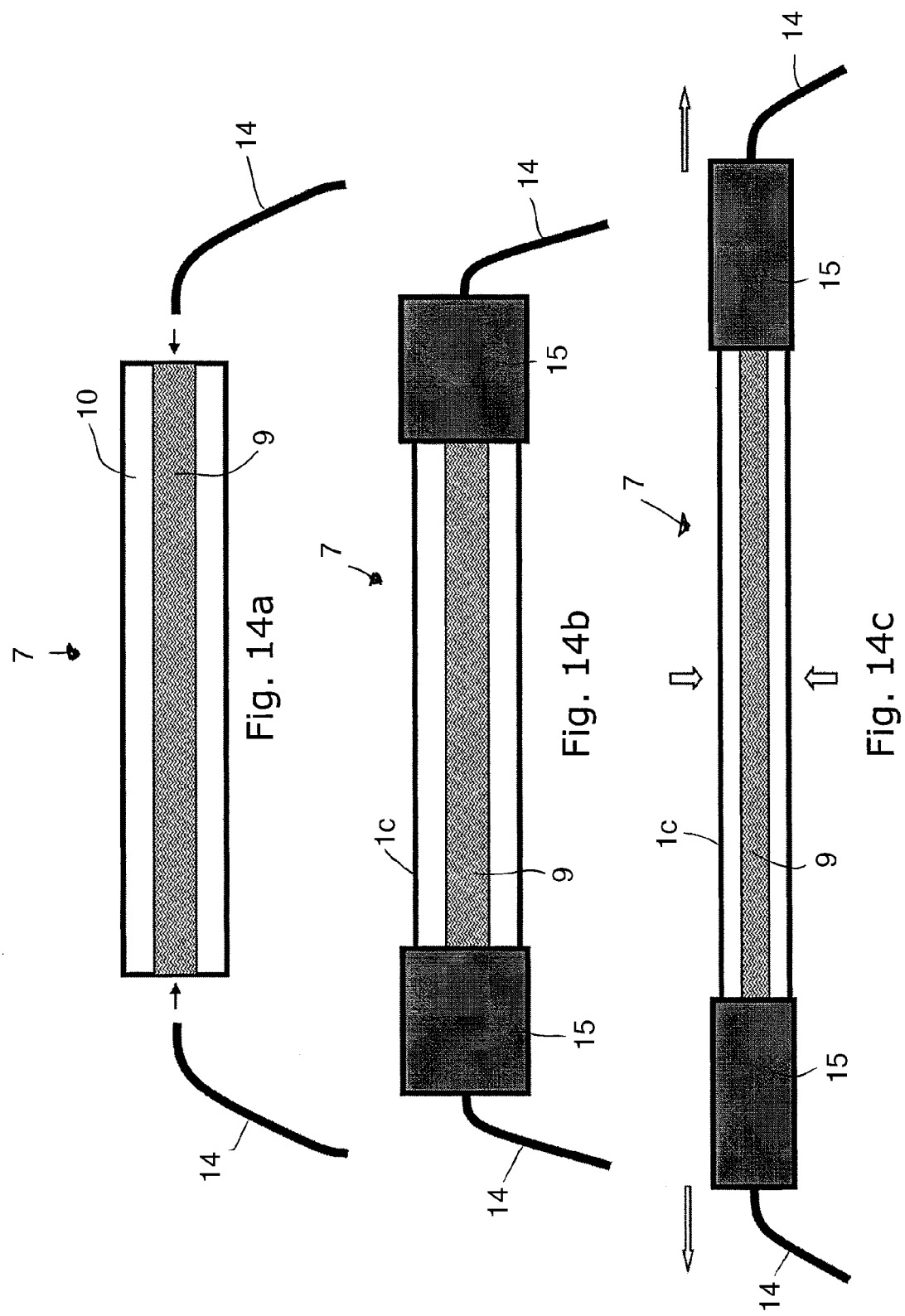

POLYMER TRANSDUCER AND A CONNECTOR FOR A TRANSDUCER

FIELD OF THE INVENTION

The invention relates to a transducer comprising a laminate with a film of a dielectric polymer material arranged between first and second layers of an electrically conductive material. A conductor facilitates application of an electrical potential between the first and second layers, and due to the electrical field which may arise, the polymer material is deformed by the first and second layers when they are moved to or from each other.

BACKGROUND OF THE INVENTION

An electrical potential difference between two electrodes located on opposite surfaces of an elastomeric body generates an electric field leading to a force of attraction. As a result, the distance between the electrodes changes and the change leads to compression of the elastomeric material which is thereby deformed. Such structures can be used for making transducers for various purposes. When implemented as actuators they are sometimes referred to as "artificial muscles" due to certain similarities with a muscle. They can also be used as sensors for sensing strain, deflection, temperature variation, pressure etc., or they can be used as generators for converting mechanical energy to electrical, sometimes referred to as energy harvesting. Herein we will generally refer to these structures as transducers or polymer transducers.

U.S. Pat. No. 6,376,971 discloses a compliant electrode which is positioned in contact with a polymer in such a way, that when applying a potential difference across the electrodes, the electric field arising between the electrodes contracts the electrodes against each other, thereby deflecting the polymer.

Due to the deformation of the polymer, the electrodes move, and the connector which connects the electrode to a power source must constantly follow the movement of the electrode. Typically, the connector is made sufficiently long to avoid that the electrode constitutes a constraint for the free movement of the polymer and thus reduces the efficiency of the device. Evidently, the long connectors may get entangled or be in the way. Furthermore, fatigue may be experienced over time whereby the conductance of the connector is reduced or the connector may fail completely. Finally, it is generally difficult to provide an even distribution of an electrical field in a very thin electrode. Normally, the resistance in the electrode is high, and the resistance may increase depending on the degree of expansion of the polymer.

Additionally, traditional connectors are typically only attached to the electrode at an end point of the connector, i.e. at a single point of attachment, since otherwise the connector would again limit the movement of the electrode and thus the elastic deformation of the polymer. Due to this single-point attachment, it may be difficult to obtain an even distribution of the electrical field in the typically very thin electrodes.

SUMMARY OF THE INVENTION

It is an object of embodiments of the invention to provide a transducer, a connector for a transducer, and a method of making a transducer to potentially improve the performance and reduce the above mentioned drawbacks of the existing connectors. Particularly, it may be seen as objects of embodiments to improve the conductivity to and from the electrodes, to improve the distribution in the electrodes and to improve the lifetime of transducers.

According to a first aspect, the invention provides a transducer comprising conductors and a laminate, the laminate comprising a film of a dielectric polymer material arranged between first and second electrodes, and each electrode being in electrically conductive communication with at least one of the conductors to facilitate an electrical potential between the electrodes and thereby enable deflection of the polymer material in response to an electrical field, wherein at least one of the conductors is an elastically deformable conductor comprising a compliant core which is electrically conductive, the core being enclosed in a containment having elastomeric properties.

Since the core is made from a compliant and conductive material, the invention provides connectivity with a connector which can be elastically deformable to match the elastic deformability of the film, and the risk of fatigue is reduced or completely avoided at least with regard to the conductive core. Accordingly, the connector may follow the movement of the electrode without limiting the movement of the film.

By conductive is herein meant that it can conduct an electrical current, e.g. having an ohmic resistivity below $10^{-4}$ $\Omega \cdot cm$, such as a resistivity in the range of that of aluminum, copper, silver, or alloys containing such metals.

The dielectric material of the film may be a polymer, e.g. an elastomer, such as a silicone elastomer, such as a weak adhesive silicone. A suitable elastomer is Elastosil RT 625, manufactured by Wacker-Chemie. Alternatively, Elastosil RT 622 or Elastosil RT 601, also manufactured by Wacker-Chemie may be used. As an alternative, other kinds of polymers may be chosen.

In the case that a dielectric material which is not an elastomer is used, it should be noted that the dielectric material should have elastomer-like properties, e.g. in terms of elasticity. Thus, the dielectric material should be deformable to such an extent that the composite is capable of deflecting and thereby pushing and/or pulling due to deformations of the dielectric material. The electrodes may have a thickness in the range of 0.01-0.1 µm, and the film may have a thickness between 10 µm and 200 µm, such as between 20 µm and 150 µm, such as between 30 µm and 100 µm, such as between 40 µm and 80 µm.

The electrodes may have a resistivity which is less than $10^{-4}$ $\Omega \cdot cm$. By providing an electrode having a very low resistivity the total resistance of the electrodes will not become excessive, even if very long electrodes are used.

The electrodes may be made from a metal or an electrically conductive alloy, e.g. from a metal selected from a group consisting of metals, such as silver, gold, and nickel. Alternatively other suitable metals or electrically conductive alloys may be chosen. The electrodes may be applied to the dielectric film using standard commercial physical vapour deposition (PVD) techniques.

The dielectric material of the film may have a resistivity which is larger than $10^{10}$ $\Omega \cdot cm$. Preferably, the resistivity of the dielectric material is much higher than the resistivity of the electrodes, preferably at least $10^{14}$-$10^{18}$ times higher.

The containment may be made from an elastomer, or from a material having elastomeric properties, i.e. a material having characteristics similar to an elastomer with regard to electrical conductivity and elasticity.

The compliant core may comprise fluid, grease, gel, elastomer, powder, pasta, or mixtures hereof, such as a metal powder in a gel.

The laminate may comprise a film of a dielectric material having a first surface and second surface, at least the first surface comprising a surface pattern of raised and depressed surface portions. A first electrically conductive layer is deposited onto the surface pattern and forms an electrode thereon. To enable elongation of the composite in one well defined direction, i.e. to provide compliance, the electrode has a corrugated shape which renders the length of the electrically conductive layer in a lengthwise direction, longer than the length of the laminate as such in the lengthwise direction. The corrugated shape of the electrode thereby facilitates that the laminate can be stretched in the lengthwise direction without having to stretch the electrode in that direction, but merely by evening out the corrugated shape of the electrode. The corrugated shape of the electrode may be a replica of the surface pattern of the film.

Since the electrode is deposited onto the surface pattern of the film and is formed by the shape thereof, a very precise shape of the corrugation of the electrode can be defined, and an improved compliance towards deformation in a specific direction can be provided by a suitable design of the surface pattern on the film. Accordingly, the laminate can facilitate increased actuation forces, or in general an increased rate of conversion between mechanical and electrical energies, increased lifetime and improved reaction time when the laminate is used in a transducer.

The compliance of the laminate in the compliant direction may be at least 50 times larger than its compliance in the non-compliant direction, i.e. perpendicularly to the compliant direction.

In one embodiment, the laminate may comprise a multi-layer composite e.g. by arranging films each with at least one electrode in a stack and by applying an electrical potential difference between each adjacent electrodes in the stack so that the layers are biased towards each other while they are simultaneously flattened out. Due to the properties of the film, this may bond the layers together. As an alternative or in addition, the layers may be bonded by an adhesive arranged between each layer. The adhesive should preferably be selected not to dampen the compliance of the multilayer structure. Accordingly, it may be preferred to select the same material for the film and adhesive, or at least to select an adhesive with a modulus of elasticity being less than the modulus of elasticity of the film.

The composite layers in the multilayer composite should preferably be identical to ensure a homogeneous deformation of the multilayer composite throughout all layers, when an electrical field is applied. Furthermore, it may be an advantage to provide the corrugated pattern of each layer either in such a way that wave crests of one layer are adjacent to wave crests of the adjacent layer or in such a way that wave crests of one layer are adjacent to troughs of the adjacent layer.

The containment may be conductive and may separate the compliant core from the electrode to enable conduction from the core through the containment to the electrode, whereby the containment may be able to protect and retain the core, while at the same time enabling conduction from the core to the electrode.

The conductor may be formed as an elongated body like a tradition wire. In another embodiment, the conductor may be formed as a pouch being circular, oval, or of another shape suitable for establishing the electrically communication with one of the electrodes.

In one embodiment, the laminate may be arranged in a spiral configuration and may thereby form a roll with a body extending axially between two end faces. Thus, a very long length of the laminate may thereby be in a more compressed form, while at the same time having a multi-layer composite.

The electrodes may have anisotropic stretchability, or anisotropic compliance. The anisotropic compliance/stretchability may be caused by the electrodes which may be formed at a wave shaped surface pattern. This surface pattern may create an electrode with a length in one direction being substantially longer than the length of the laminate as such, and the laminate can therefore be stretched in one direction without stretching the electrode. This provides the compliance in this direction, i.e. the anisotropic stretchability. Conversely, the lack of compliance in other directions can also be provided by the same electrode because it is substantially less elastically deformable than the film. The ratio between a modulus of elasticity of the electrode and a modulus of elasticity of the film may be larger than 200.

A laminate may in one embodiment be rolled relative to the anisotropic stretchability such that an electrical field causes radial expansion or contraction of the roll.

To facilitate conductive communication between the conductor and the electrode, the containment may be formed about a contacted one of the end faces. In one embodiment, the first and second electrodes may each contact a containment at an end face of the roll thereby enabling radial expansion or contraction of the roll in response to an electrical field, i.e. an electrical potential between the two end faces of the roll.

The laminate may be formed so that the one of the electrodes is formed to an edge of the film such that the electrode extends to the contacted end face, such that an outer surface of the containment may be located in plane with the end face and be in electrical contact with the electrode which is terminated at that end face.

The other electrode may on the contrary be formed to an edge of the film in the opposite direction such that this electrode extends to the other contacted end face, thereby facilitating contact between the other electrode and the other conductor. Thereby the two electrodes do only extend to one edge of the film, i.e. to opposite edges so that each of the electrodes is contact with only one conductor. At a middle portion of the film, an overlapping portion of the electrodes exist where the film can be deformed between the electrodes.

To facilitate contact between an electrode and a conductor, the compliant core may be in direct contact with a surface of one of the first and second electrodes. This may be facilitated by providing an aperture in the containment, the aperture being arranged at the contacted end face of the roll.

In another embodiment, the laminate may be rolled perpendicular to the anisotropic stretchability, whereby an electrical field causes a lengthwise expansion or contraction of the roll.

In yet another embodiment, a laminate may be folded along the length of the laminate to have a multi-layer composite with a reduced length.

The conductance, G (I/V), of the containment may be in the range of 1-50 pct. of the conductance, G, of the compliant core.

The elastic elongation of the containment may be in the range of 10-200 pct. of the elastic elongation of the film. By 'elastic elongation' is herein meant, the percentage elongation which can be reached without permanently deforming the polymer material.

In one embodiment, the containment and the film may comprise an identical polymer material.

The compliant core may comprise a metal which is liquid at room temperature. The conductor may thus be manufactured at a lower temperature where the metal is solid to facilitate positioning of the containment so that it encloses the core. Subsequently, the conductor may be arranged at room temperature, whereby the core becomes liquid.

Additionally, the compliant core may comprise a material selected from the group consisting of: aluminum, copper, nickel, silver, carbon, mercury, and combinations hereof. As mentioned above, the core may comprise fluid, grease, gel, elastomer, powder, pasta, or mixtures hereof, such as a metal powder in a gel, or a conductive carbon powder.

Furthermore, the compliant core may comprise an amorphous alloy, i.e. a non-crystalline alloy. These alloys may contain atoms of significantly different sizes, leading to low free volume in liquid state. Furthermore, these alloys soften and flow upon heating.

In one embodiment, the containment may be tubular with an inner lumen extending in an axial direction.

The cross-section of the containment may change along the axial direction. As an example, the cross-section may be substantially circular with an increasing and decreasing area, the outer surface being wave shaped. This may have the advantage, that the containment can be elongated without reducing the cross-sectional area of the inner lumen at the positions it is thinnest. When the conductor is stretched, the containment deforms by reduction of the cross-sectional area at the positions where the containment is thickest so that the cross-sectional area at these positions may be decreased.

It should be understood, that the cross-sectional area may be of any shape, i.e. the containment may have a non-circular cross-section perpendicular to the axial direction.

To reduce the risk of leakage from the containment, if the containment should break or in any other way be damaged, the containment may form a plurality of compartments, each compartment enclosing a compliant core. Thereby it may be ensured, that only the compliant core or parts hereof from a single compartment is leaked in case of damage of the containment.

To facilitate that the deformable conductor is current-carrying through out the total length, each compliant core may be in electrical communication with an adjacent compliant core by the conductivity of the containment.

Furthermore, the containment may contain only the compliant core, e.g. by ensuring that the containment does not contain air bubbles or the like, as such bubbles may hinder or reduce current-carrying along the length of the conductor. Bubbles may especially be a problem during expansion of the conductor, as the cross-sectional area hereof may be decreased during the expansion.

Electrical communication through out the length of the conductor may also be facilitated by choosing a compliant core which comprises an incompressible medium, such as a liquid or a powder, as the incompressible medium may extend along the full length of the conductor also during expansion hereof.

The transducer may furthermore comprise a control system which is capable of determining an electrical characteristic of the conductor and to determine therefrom, a degree of elongation of the conductor. The electrical characteristic may as an example be resistance, capacitance, inductance, or a combination hereof.

In one embodiment of a transducer, at least one of the conductors may be in electrically conductive communication with one of the electrodes substantially along a compliant direction to enable deflection of the polymer material in response to an electrical field. Thus, the conductor itself may be expanded and contracted together with the laminate. The conductor may be in electrically conductive communication along the compliant direction when being positioned parallel to the compliant direction and being positioned within +/−45 degrees to compliant direction.

The laminate may be rolled along the compliant direction to form a roll such that an electrical field causes radial expansion or contraction of the roll. If the transducer comprises at least one of the conductors in electrically conductive communication with one of the electrodes substantially along a compliant direction, it may thereby be ensured that the conductor does not restrict the movement of the roll, as the elastically deformable conductor may expand and contract together with the laminate.

To enable an electrical potential between the electrodes, the conductor may be connected to a traditional wire. As such a traditional wire is stiff compared to the elastically deformable conductor, stress may occur about the joint due to the concentration of tension. Such stress may weaken the joint.

The conductor may comprise at least two different portions facilitating functions and having different elastic properties. Herein these two portions are referred to as a primary portion and a transition portion. The transition portion may facilitate connection of the elastically deformable conductor to a traditional non-elastically deformable wire, and the transition zone may be less elastically deformable than the primary portion. The primary portion of the conductor should be understood as the portion of the conductor being adhesively and/or electrically coupled to one of the electrodes. It should further be understood, that primary is not related to size, as the primary portion of the conductor in some embodiments may be larger than the transition zone and in other embodiments may be smaller than the transition zone.

If the conductor is formed as an elongated body, the transition zone may be formed as an extension hereto. Furthermore, a conductor being pouch formed, e.g. having a circular shape, may comprise a transition zone formed as a flange along the circumference or a part hereof of the conductor.

According to a second aspect, the invention provides a conductor comprising a conductive compliant core enclosed in an elongated containment made from an elastomer, wherein the elastomer is conductive.

It should be understood, that the conductor according to the second embodiment of the invention may comprise any of the features mention above in connection with the first embodiment of the invention, as these features may also be applicable to the conductor of the second aspect of the invention.

According to a third aspect, the invention provides a method of making a conductor for an electroactive polymer transducer, the method comprising the steps of:
providing a core material;
bringing the core material to a solid state;
moulding a containment onto the core material by solidifying a polymer material around the core; and
bringing the core material to a liquid state.

It should be understood, that the features of the first and second aspect of the invention may also be applicable to the method according the third aspect of the invention.

BRIEF DESCRIPTION OF THE DRAWINGS

Embodiments of the invention will now be further described with reference to the drawings, in which:
FIGS. 14a-14c illustrate a conductor.

DETAILED DESCRIPTION OF THE PREFERRED EMBODIMENTS

It should be understood that the detailed description and specific examples, while indicating embodiments of the invention, are given by way of illustration only, since various changes and modifications within the spirit and scope of the invention will become apparent to those skilled in the art from the detailed description.

Figure 1A:
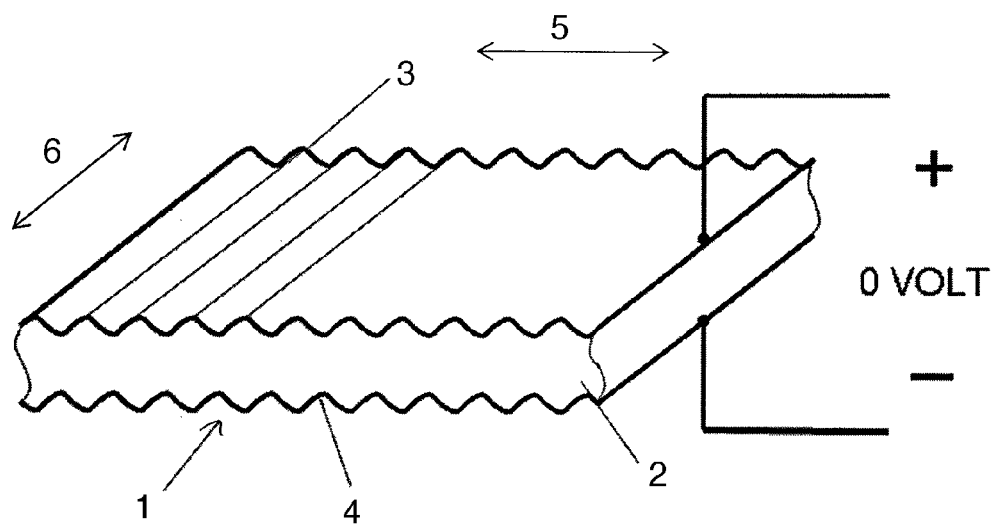
FIGS. 1a and 1b illustrate an example of a laminate.
Figure 1B:
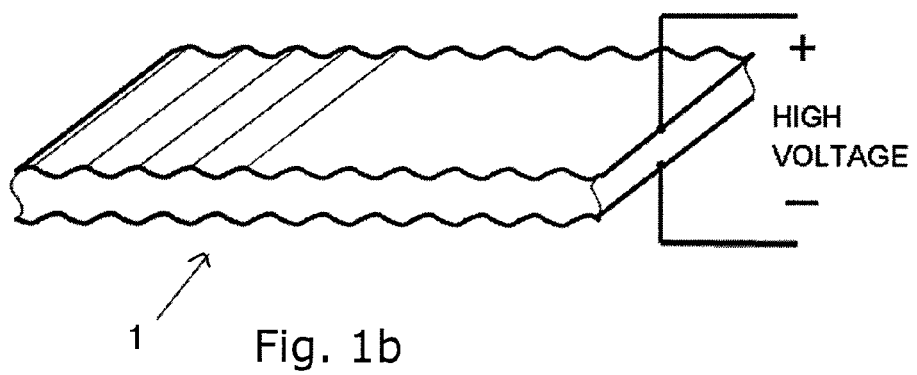

FIGS. 1a and 1b illustrate a laminate 1 comprising a film 2 of a dielectric polymer material arranged between first and second electrodes 3, 4. In FIG. 1a the laminate 1 is exposed to zero electrical potential difference, and in FIG. 1b the laminate 1 is exposed to a high electrical potential difference. As illustrated in FIG. 1b, the film 2 is expanded, while the electrodes 3, 4 are evened out, when exposed to an electrical potential difference.

The laminate 1 comprises a film 2 made of a dielectric material having an upper and lower surface provided with a pattern of raised and depressed surface portions, thereby forming a designed corrugated profile of the surface. An electrically conductive layer has been applied to the upper and lower surface, the electrically conductive material being deposited so that the electrically conductive layer is formed according to the pattern of raised and depressed surface portions, thereby forming a first and second electrode 3, 4 on opposite sides of the film 2. In terms of everyday physical things, the film 2 resembles in some aspects household wrapping film. It has a similar thickness and is comparably pliable and soft. However, it is more elastic than such a film, and has a marked mechanical anisotropy as will be explained in the following.

The dielectric material may be an elastomer or another material having similar characteristics.

Due to the pattern of raised and depressed surface portions, the electrodes 3, 4 may even out as the film 2 expands, and recover its original shape as the film 2 contracts along the direction defined by the arrow 5 without causing damage to the electrodes 3, 4, this direction thereby defining a direction of compliance. Accordingly, the laminate 1 is adapted to form part of a compliant structure capable of withstanding large strains.

As described above, the corrugated surface profile is directly impressed or moulded into the dielectric film 2, before the electrically conductive layer is deposited. The corrugation allows the manufacturing of a compliant composite using electrode materials of high elastic modulii, e.g. metal electrode. This can be obtained without having to apply pre-stretch or pre-strain to the dielectric film 2 while applying the electrically conductive layer, i.e. the electrodes 3, 4, and the corrugated profile of the finished composite 1 does not depend on strain in the dielectric film 2, nor on the elasticity or other characteristics of the electrodes 3, 4. Accordingly, the corrugation profile is replicated over substantially the entire upper and lower surfaces of the film 2 in a consistent manner, and it is possible to control this replication. Furthermore, this approach provides the possibility of using standard replication and reel-to-reel coating, thereby making the process suitable for large-scale production. For instance, the electrodes 3, 4 may be applied to the upper and lower surfaces of the dielectric film 2 using standard commercial physical vapour deposition (PVD) techniques. An advantage of this approach is that the anisotropy is determined by design, and that the actual anisotropy is obtained as a consequence of characteristics of the corrugated profile which is provided on the surfaces of the film 2 and the electrodes 3, 4 which follow the corrugated profile.

The laminate 1 shown in FIGS. 1a and 1b is designed to have a compliance in the range of the compliance of the film 2 in the direction defined by the arrow 5, and a stiffness in the range of the stiffness of the electrodes 3, 4 in a direction defined by the arrow 6. In FIGS. 1a and 1b, the compliance direction is along the length of the composite 1.

Figure 2A:
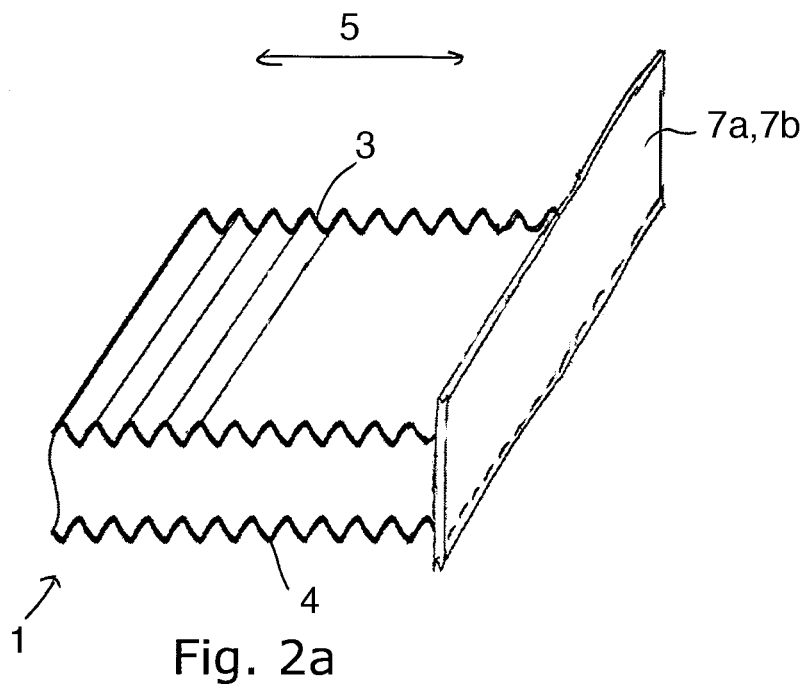
FIGS. 2a and 2b illustrate an example of a conductor connected to a laminate.
Figure 2B:
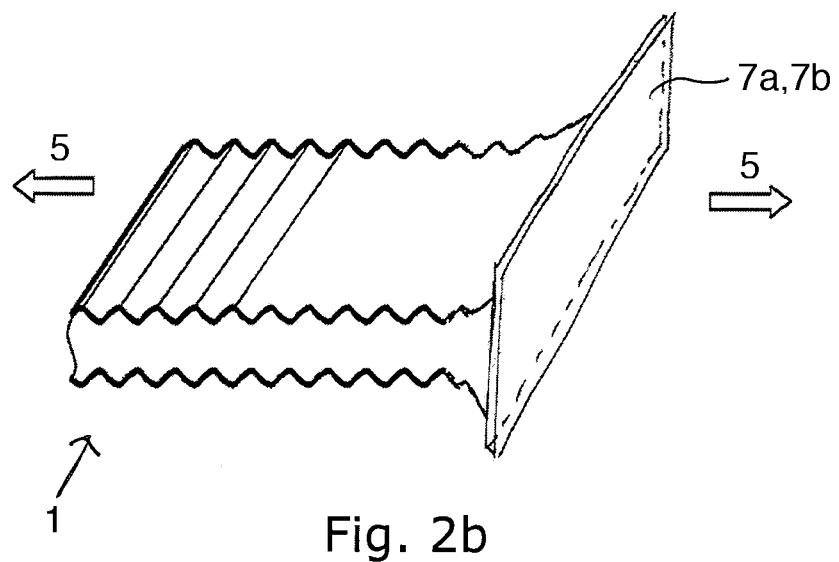

FIGS. 2a and 2b illustrate conductors 7a, 7b connected to a laminate 1, the conductors 7 being in electrically conductive communication with the electrodes 3, 4 to facilitate an electrical potential between the electrodes and thereby enable deflection of the film 2 in response to an electrical field. The conductors 7 are connected to the film in the direction where the laminate is constraint, i.e. perpendicular to the compliant direction illustrated by the arrow 5. Consequently, the conductors 7 are typically made of a stiff material, such as aluminum alloys, cupper foils, and the like. However, a drawback of this connection is that the resistance along the compliance direction may become too high, especially when the laminate it long.

Figure 3A:
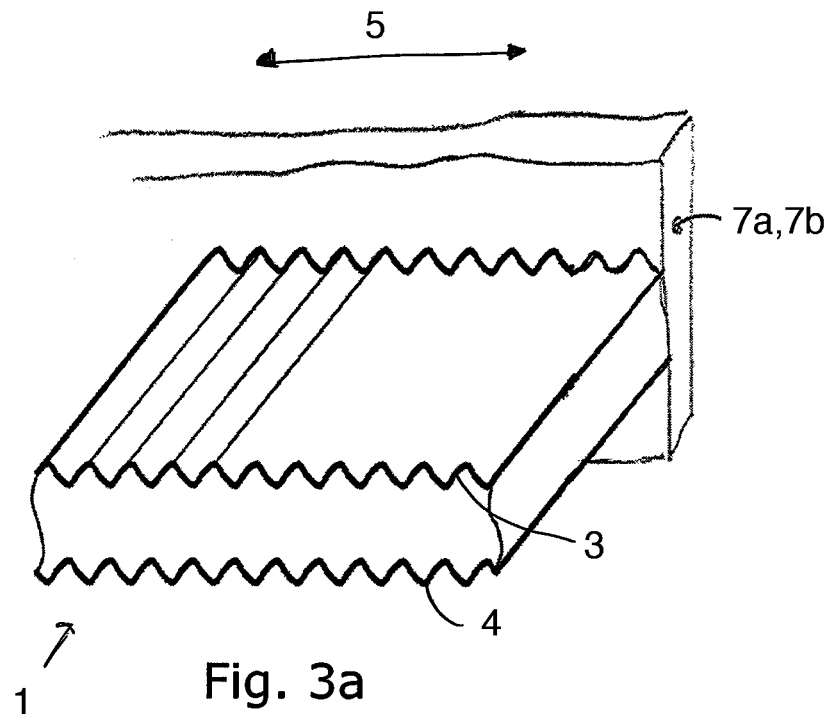
FIGS. 3a and 3b illustrate an example of a conductor connected to a laminate.
Figure 3B:
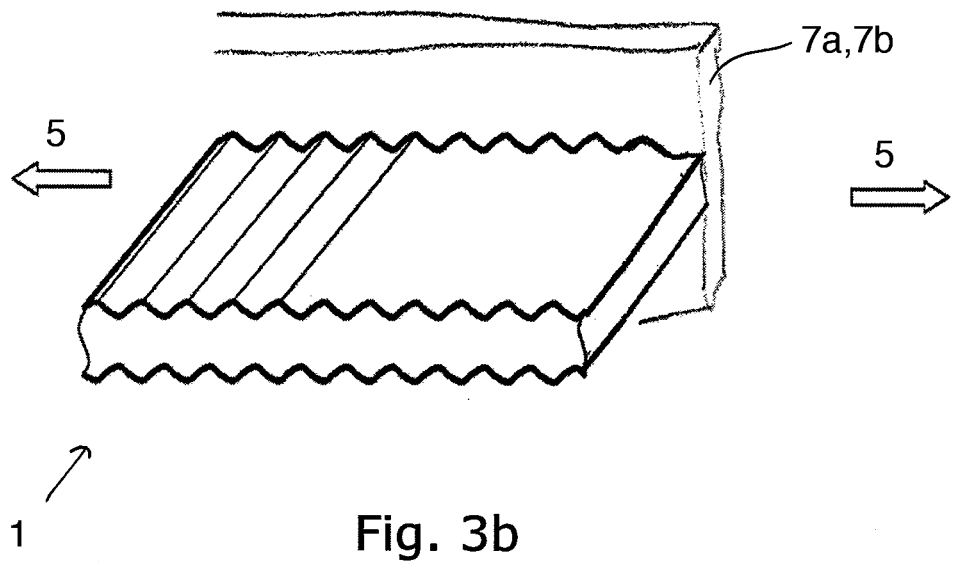

FIGS. 3a and 3b illustrate conductors 7a, 7b connected to a laminate 1, the conductors 7 being in electrically conductive communication with the electrodes 3, 4 to facilitate an electrical potential between the electrodes and thereby enable deflection of the film 2 in response to an electrical field. The conductors 7 are connected to the laminate 1 in the direction where the laminate is compliant (indicated by the arrow 5). Consequently, the conductors 7 have to be stretchable to be able to follow the deflection of the film 2 in the lengthwise direction, i.e. along the compliance length, when an electrical potential between the electrodes 3, 4 causes the deflection. Typically, the conductors 7 are made from a soft, stretchable conductive polymer having a resistance, resulting in a high resistance of the system even though the resistance of the electrodes is very low.

Figure 4A:
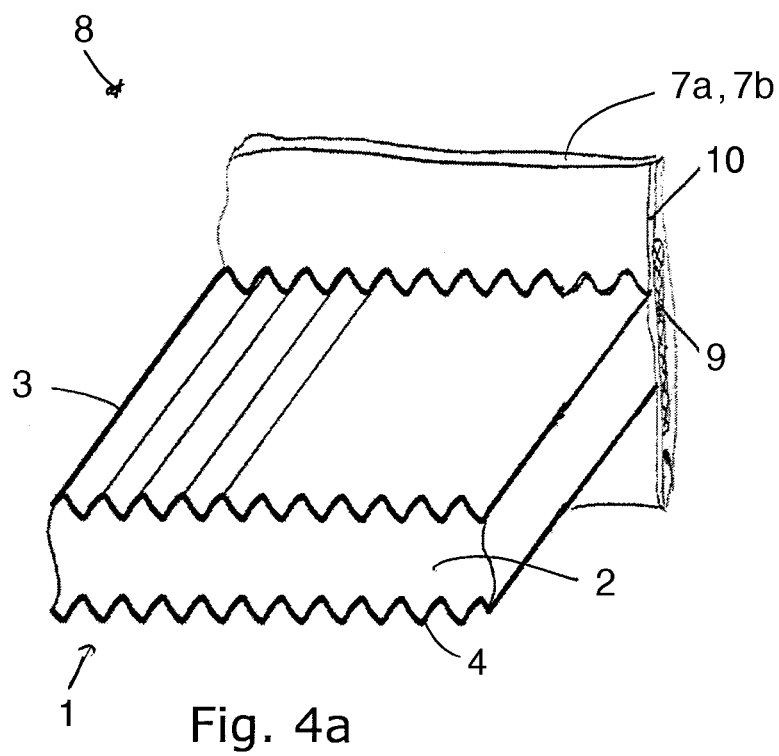
FIGS. 4a and 4b illustrate a transducer comprising a conductor connected to a laminate according to the invention.
Figure 4B:
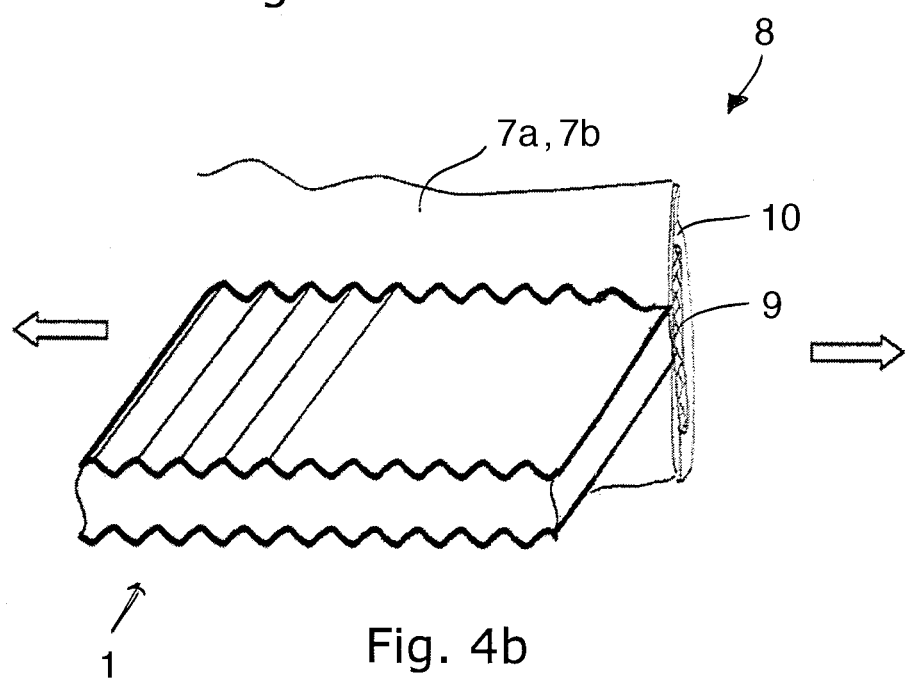

FIGS. 4a and 4b illustrate a transducer 8 comprising conductors 7a, 7b connected to a laminate 1 according to the invention. The conductors 7 are in electrically conductive communication with the electrodes 3, 4 to facilitate an electrical potential between the electrodes and thereby enable deflection of the film 2 in response to an electrical field. The conductors 7 are connected to the laminate 1 in the direction where the laminate is compliant (indicated by arrow 5). In order to obtain stretchable conductors 7 being able to carry the current into the electrode along the length of the laminate, the conductors 7 comprise a conductive compliant core 9 enclosed in a containment 10 having elastomeric properties. Even though the containment 10 is made from an elastomer with a high resistance, the resulting resistance of the conductors 7 are low due to the low thickness of the containment 10 in combination with the conductive core 9 having a low resistance. The core may be made of a fluid or powder, e.g. of carbon powder or a metal powder in a gel. Thus, the containment 10 may encapsulate the compliant core 9.

Thus, the system may be designed to have a substantially constant resistance during stretching of the laminate, as the resistance of the core increases due to the stretching and as the resistance of the containment is reduced when the containment is stretched.

Figure 5A:
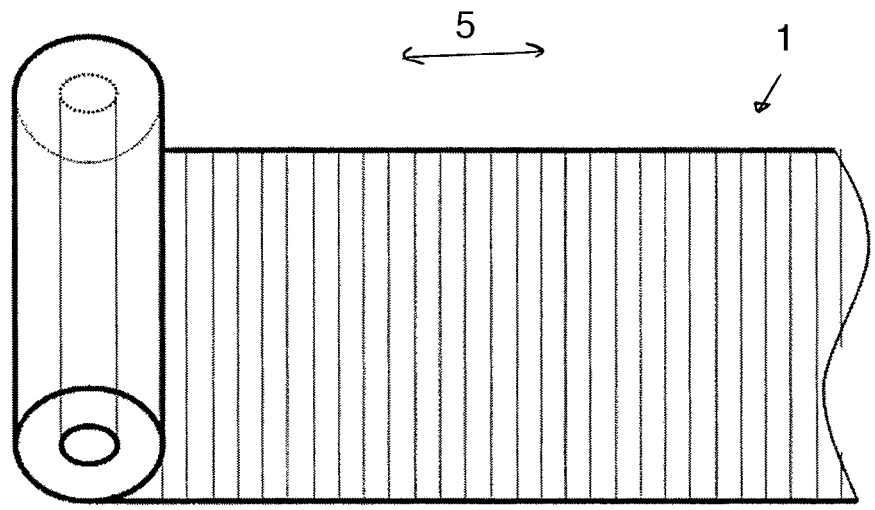
FIGS. 5a and 5b illustrate two different configurations of a rolled laminate.
Figure 5B:
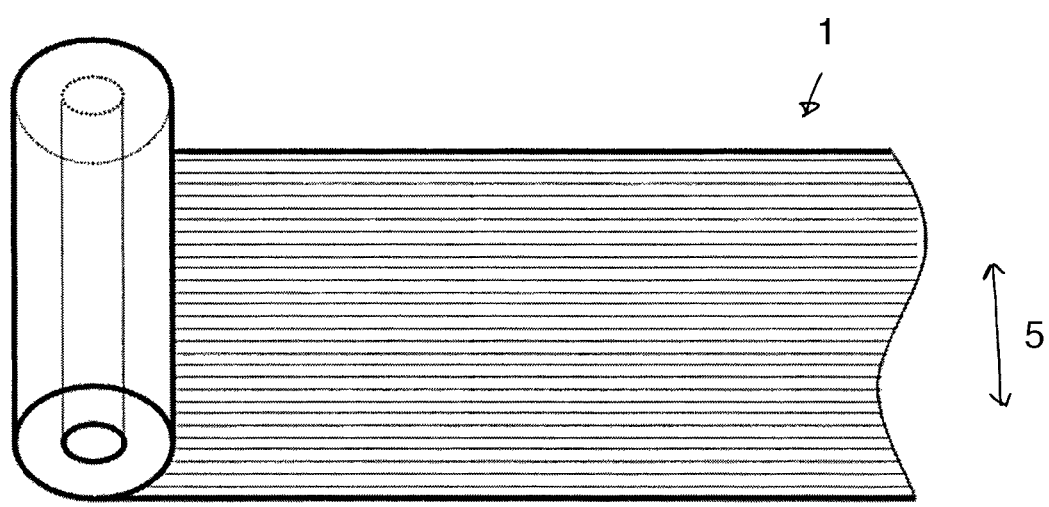

FIGS. 5a and 5b illustrate two different configurations of a rolled laminate 1. In FIG. 5a, the compliance direction (see arrow 5) is along the length of the laminate 1, whereas the compliance direction of FIG. 5b is across the laminate 1. This is indicated by the thin lines across the composite 1 in FIG. 5a and along the composite 1 in FIG. 5b, which thin lines represent the pattern of raised and depressed surface portions forming the corrugated profile. The laminate 1 may be produced in very long lengths, so called "endless" laminates which may be stored as spools as shown in FIGS. 5a and 5b. Such semi finished goods may be used for the production of transducers and the like, e.g. actuators.

FIGS. 6a-6d illustrate different embodiments of transducer 8, in which the transducer 8a is the most simple one. The transducers 8a-8d all comprise a rolled laminate 1 and conductors 7. Only one conductor 7 is illustrated in the figures, as the other conductor is in electrical conductive communication with an electrode at the other end of the rolled laminate. Only one of the electrodes 3, 4 is illustrated in the figures as only the first electrode 3 is formed to an edge of the film 2 such that the electrode 3 extends to the contacted end face of the rolled laminate, such that an outer surface of the containment 10 (not shown) is located in plane with the end face and is in electrical contact with the electrode 3 being terminated at that end face.

The other electrode 4 (not shown) is on the contrary formed to an edge of the film 2 in the opposite direction such that this electrode extends to the other contacted end face, thereby facilitating contact between the other electrode 4 and the other conductor (not shown). Thereby the two electrodes 3, 4 do only extend to one edge of the film, i.e. to opposite edges so that each of the electrodes 3, 4 is contact with only one conductor 7. At a middle portion of the film 2, an overlapping portion of the electrodes exists where the film 2 can be deformed between the electrodes 3, 4.

The transducer 8a comprises a conductive core 9 with conductance G, and a rolled laminate 1 comprising a film 2 and an electrode 3.

Figure 6A:
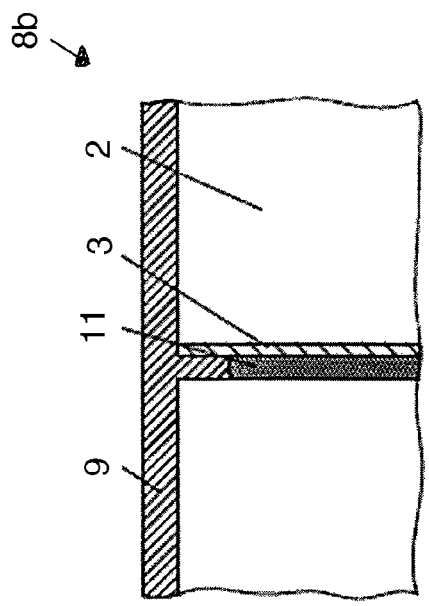
FIGS. 6a-6d illustrate different embodiments of transducer.
Figure 6B:
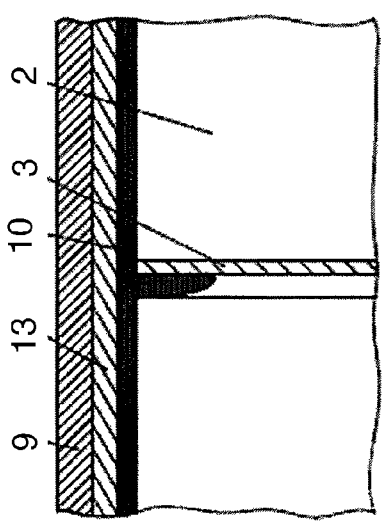

In FIG. 6b, the transducer 8b is formed so that a part of the compliant conductive core 9 of the conductor 7 is positioned between the film 2 and the electrode 3 of the rolled laminate 1. A non-conductive elastic seal 11 is provided in the gab.

Figure 6C:
Figure 6D:
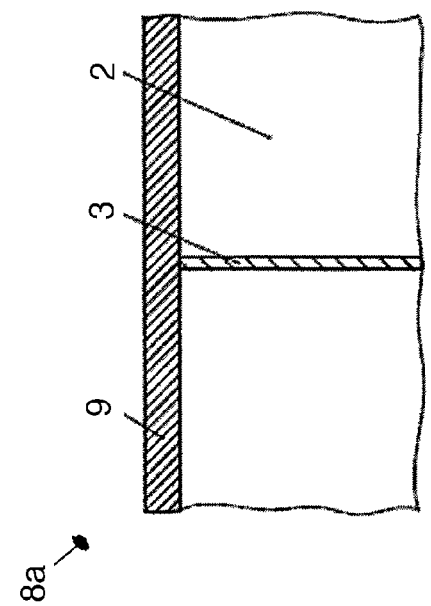
Figure 7A:
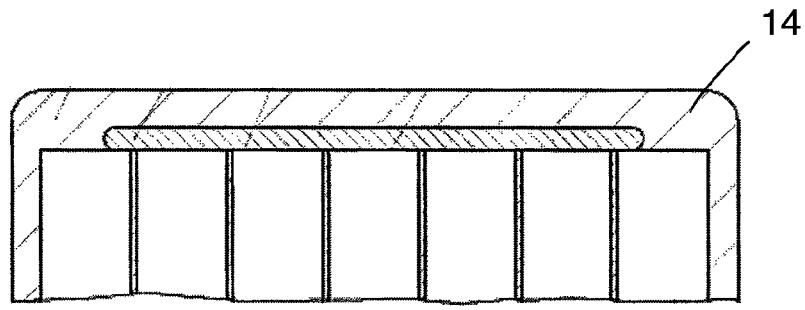
FIGS. 7a-7d illustrate the transducers of FIGS. 6a-6b with a protective coating.
Figure 7B:
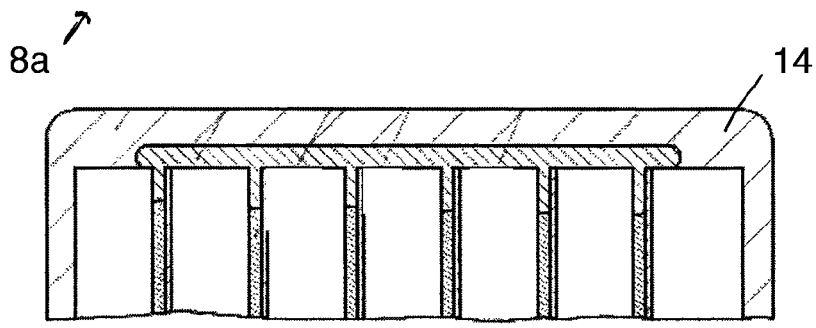
Figure 7C:
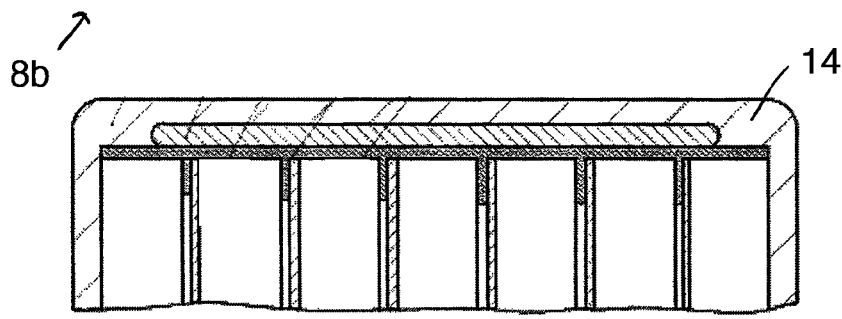
Figure 7D:
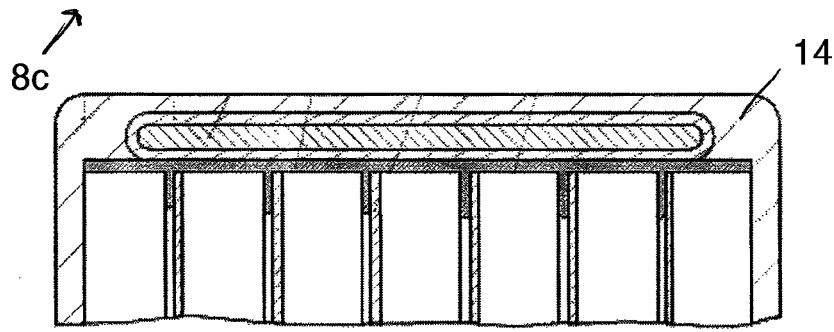

In FIG. 6c, a conductive containment 10 is provided at the end face of the rolled laminate 1. A part of the conductive containment 10 is furthermore positioned in a gab between the film 2 and the electrode 3 of the rolled laminate 1. In the embodiment of the transducer 8d illustrated in FIG. 6d, an additional conductive containment 13 is provided at the end face of the rolled laminate 1.

FIGS. 7a-7d illustrate the transducers 8a-8b of FIGS. 6a-6b with a protective coating 14 encapsulating the conductor and the end face of the laminate.

Figure 8B:
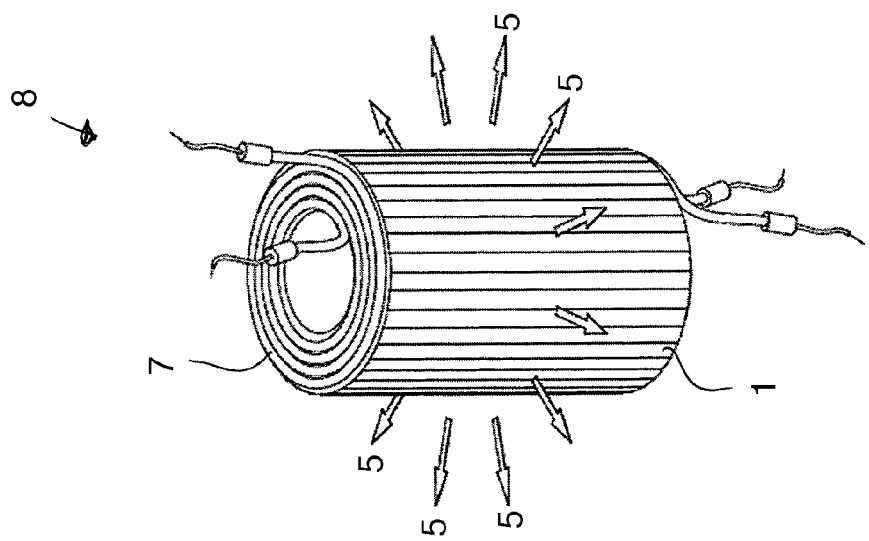
FIGS. 8a and 8b illustrate a transducer comprising a conductor connected to a rolled laminate, FIG. 9 illustrate a transducer comprising a conductor connected to an alternative embodiment of a rolled laminate.
Figure 8A:
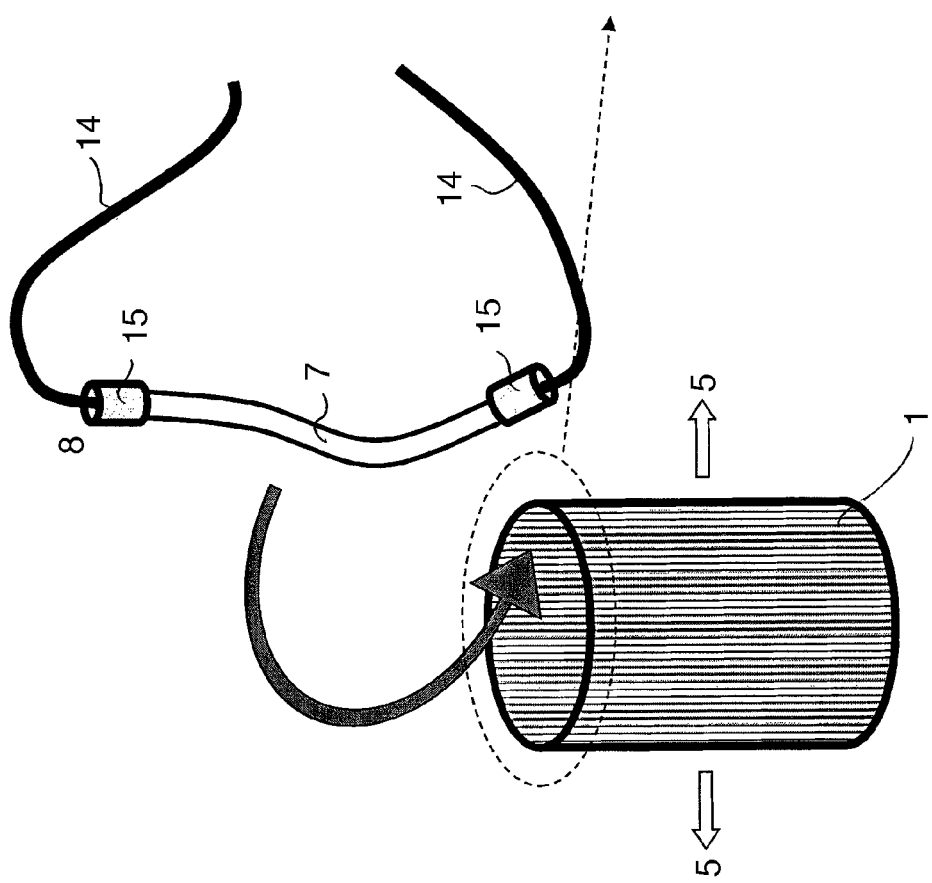

FIG. 8b illustrates a transducer 8 comprising a conductor 7 connected to a rolled laminate 1. FIG. 8a illustrates the rolled laminate 1 before connection of the conductor 7. In the illustrated embodiment, the conductor 7 has an elongated structure. Due to the elastical deformability of the conductor 7, it can be rolled and bended (see FIG. 8b) to ensure electrically conductive communication with an electrode (not shown).

As illustrated, the laminate is rolled relative to the anisotropic stretchability illustrated by the thin lines such that an electrical field causes radial expansion or contraction of the roll as indicated by the arrows 5. Due to the elastically deformable the conductor 7, it can be ensured that the conductor 7 does not restrict the movement of the roll, as the conductor 7 expands and contracts together with the rolled laminate 1.

In order to enable an electrical potential between the electrodes, the conductor 7 is connected to a traditional wire 14 via a joint 15.

Figure 9:
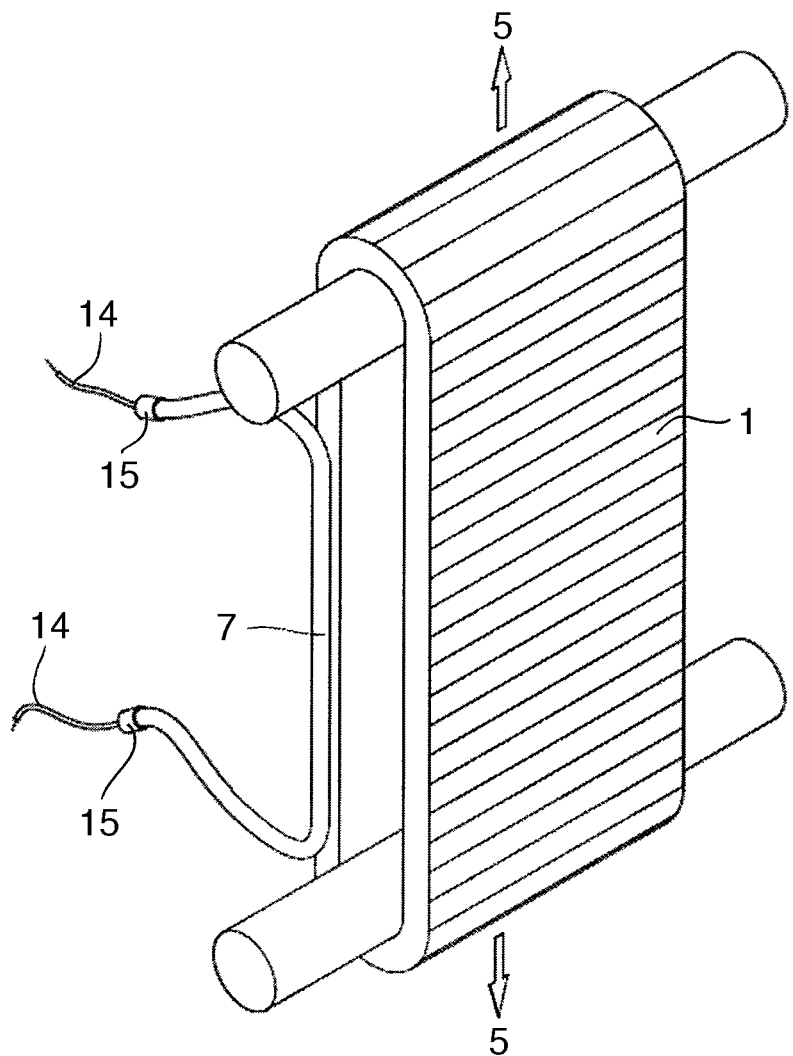

FIG. 9 illustrates another embodiment of a transducer 8 comprising a conductor 7 connected to a laminate 1 being rolled in the lengthwise direction, whereby an electrical field causes a lengthwise expansion or contraction of the roll as indicated by the arrows 5. Due to the elastically deformable conductor 7, the conductor 7 expands and contracts together with the rolled laminate 1.

In order to enable an electrical potential between the electrodes, the conductor 7 is connected to a traditional wire 14 via a joint 15.

Figure 10:
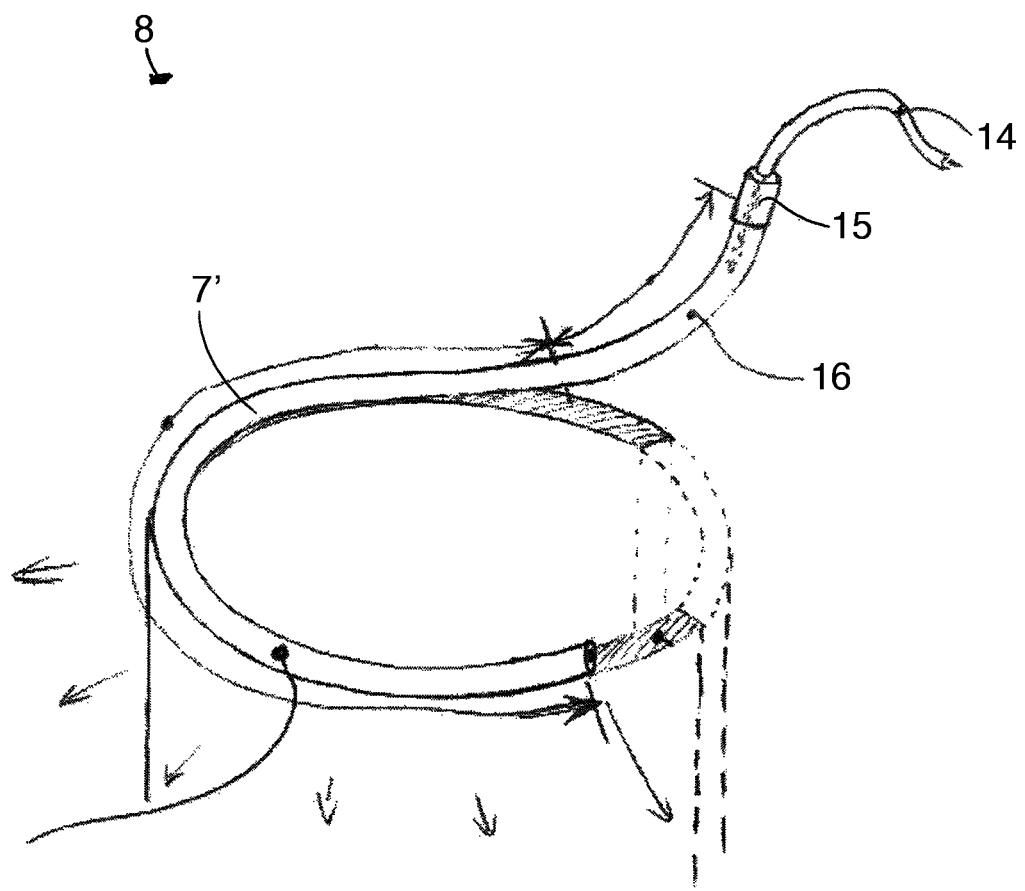
FIG. 10 illustrates a transducer comprising a conductor comprising a transition zone, the conductor being connected to a rolled laminate.

FIG. 10 illustrates a transducer 8 comprising a conductor 7 and a rolled laminate 1. The transducer 8 is similar to the transducer illustrated in FIGS. 8a and 8b. To enable an electrical potential between the electrodes, the conductor 7 is connected to a traditional wire 14 via a joint 15.

As such a traditional wire 14 is stiff compared to the elastically deformable conductor 7, stress may occur about the joint due to the concentration of tension. Such stress may weaken the joint.

The conductor 7 therefore comprises two different portions, a primary portion 7' and a transition portion 16. The transition portion 16 facilitates connection of the elastically deformable conductor 7 to the traditional non-elastically deformable wire 14. The transition zone 16 is less elastically deformable than the primary portion 7'. The primary portion 7' of the conductor is the portion of the conductor 7 being adhesively and/or electrically coupled to one of the electrodes (not shown).

Figure 11:
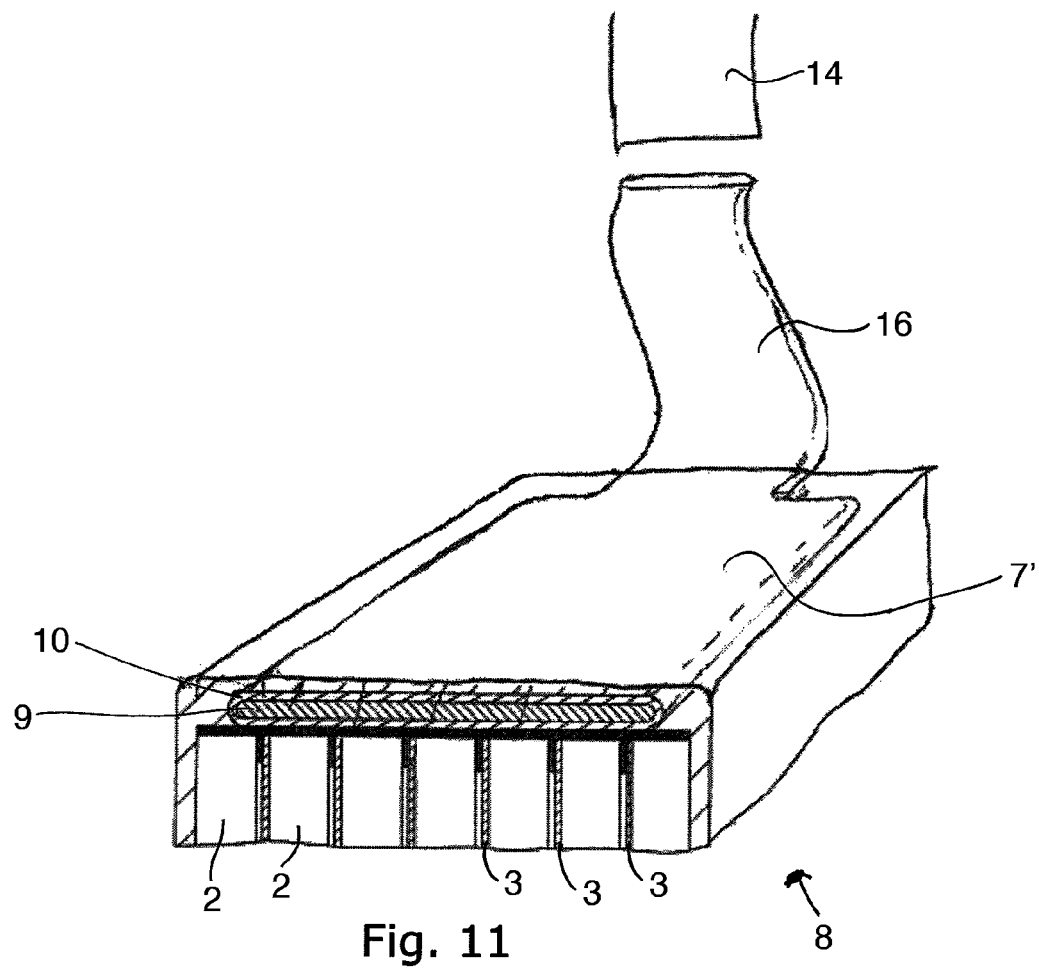
FIG. 11 illustrates a transducer comprising a conductor comprising a transition zone, the conductor being connected to a laminate.

FIG. 11 illustrates another embodiment of a transducer 8 comprising a conductor 7 having a transition zone 16 for connection to a traditional wire 14.

Figure 12:
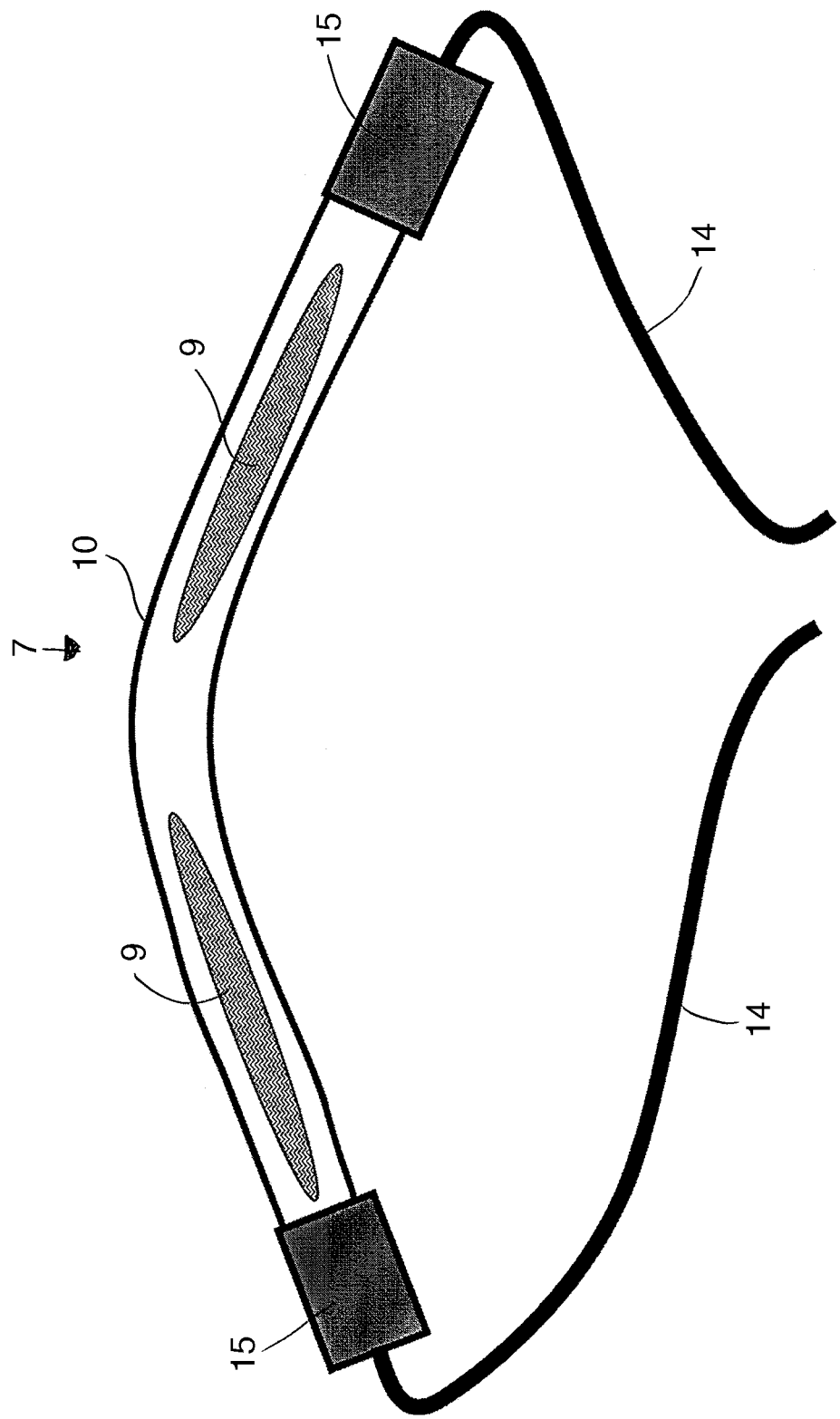
FIG. 12 and FIG. 13 illustrate conductors.
Figure 13:
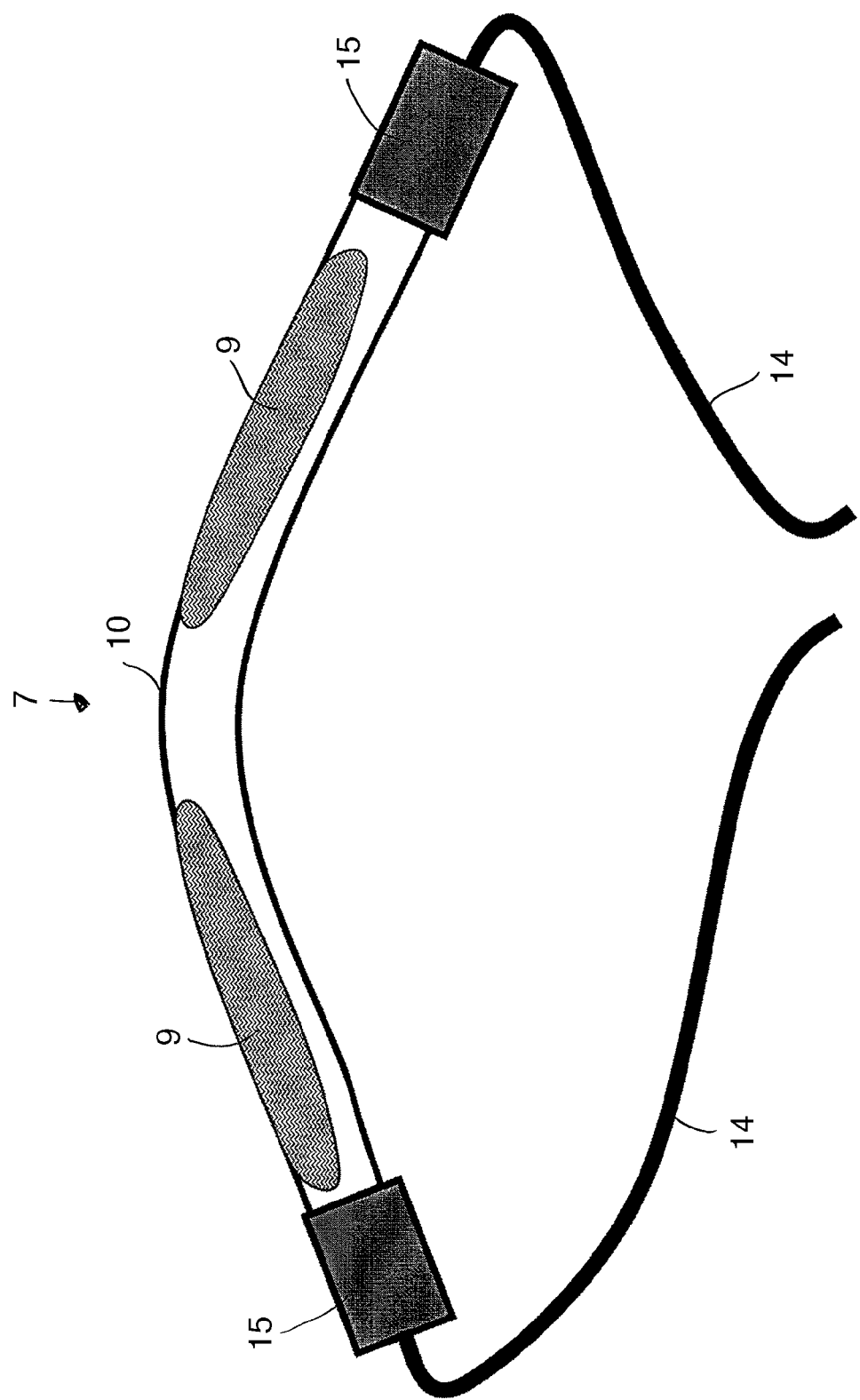

FIG. 12 and FIG. 13 illustrate conductors 7 comprising a compliant core 9 being enclosed in a containment 10. The conductor 7 is connected to a traditional wire 14 via a joint 15. The transition zone 16 is not shown in these figures.

In FIGS. 12 and 13, the containment 10 comprises two compartments, each comprising a compliant core 9. In FIG. 13, openings are provided in the containment to allow for direct contact between the compliant core 9 and the electrode (not shown).

FIGS. 14a-14c illustrate a conductor 7. FIGS. 14a and 14b illustrate one example of how to assemble a conductor 7 comprising a compliant core 9 enclosed in a containment with a traditional wire 14 via a joint 15.

In FIG. 14c it is illustrated how the conductor 7 is extended together with the laminate (not shown) in response to an electrical field causing an expansion of the laminate.

While the present invention has been illustrated and described with respect to a particular embodiment thereof, it should be appreciated by those of ordinary skill in the art that various modifications to this invention may be made without departing from the spirit and scope of the present.

What is claimed is:

1. A transducer comprising conductors and a laminate, the laminate comprising a film of a dielectric polymer material arranged between first and second electrodes, and each electrode being in electrically conductive communication with at least one of the conductors to facilitate an electrical potential between the electrodes and thereby enable deflection of the polymer material in response to an electrical field, wherein at least one of the conductors is an elastically deformable conductor comprising a compliant core which is electrically conductive, the core being enclosed in a containment having elastomeric properties, wherein the containment is electrically conductive.

2. The transducer according to claim 1, wherein the containment separates the compliant core from the electrode to enable conduction from the core through the containment to the electrode.

3. The transducer according to claim 2, wherein the laminate forms a roll with a body extending axially between two end faces.

4. The transducer according to claim 1, wherein the electrodes have anisotropic stretchability.

5. The transducer according to claim 3, wherein the laminate is rolled relative to the anisotropic stretchability such that an electrical field causes radial expansion or contraction of the roll.

6. The transducer according to claim 3, wherein the containment is formed about a contacted one of the end faces.

7. The transducer according claim 6, wherein one of the electrodes is formed to an edge of the film such that the electrode extends to the contacted one of the end faces.

8. The transducer according to claim 1, wherein the conductance, G (I/V), of the containment is in the range of 1-50 pct. of the conductance, G, of the compliant core.

9. The transducer according to claim 1, wherein the elastic elongation of the containment is in the range of 10-200 pct. of the elastic elongation of the film.

10. The transducer according to claim 1, wherein the containment and the film comprises an identical polymer material.

11. The transducer according to claim 1, wherein the compliant core comprises a metal which is liquid at room temperature.

12. The transducer according to claim 1, wherein the compliant core comprises a material selected from the group consisting of: aluminium, copper, nickel, silver, carbon, mercury, and combinations hereof.

13. The transducer according to claim 1, wherein the compliant core comprises an amorphous alloy.

14. The transducer according to claim 1, wherein the containment is tubular with an inner lumen extending in an axial direction.

15. The transducer according to claim 14, wherein the containment has a cross-section which changes along the axial direction.

16. The transducer according to claim 14, wherein the containment has a non-circular cross-section perpendicular to the axial direction.

17. The transducer according to claim 1, wherein the containment forms a plurality of compartments, each compartment enclosing a compliant core.

18. The transducer according to claim 17, wherein each compliant core is in electrical communication with adjacent compliant core by the conductivity of the containment.

19. The transducer according to claim 1, wherein the containment contains only the compliant core.

20. The transducer according to claim 1, wherein the compliant core comprises an incompressible medium.

21. The transducer according to claim 1, wherein at least one of the conductors is in electrically conductive communication with one of the electrodes substantially along a compliant direction to enable deflection of the polymer material in response to an electrical field.

22. The transducer according to claim 21, wherein the laminate is rolled along the compliant direction to form a roll such that an electrical field causes radial expansion or contraction of the roll.

23. The transducer according to claim 1, wherein the conductor comprises a transition zone which is less elastically deformable than a primary portion of the conductor.

* * * * *